United States Patent [19]
Kirkpatrick, Jr.

[11] 4,045,785
[45] Aug. 30, 1977

[54] SENSE AMPLIFIER FOR STATIC MEMORY DEVICE

[75] Inventor: James William Kirkpatrick, Jr., Santa Clara, Calif.

[73] Assignee: American Microsystems, Inc., Santa Clara, Calif.

[21] Appl. No.: 629,032

[22] Filed: Nov. 5, 1975

[51] Int. Cl.² ............................................. G11C 7/06
[52] U.S. Cl. ............................... 340/173 R; 307/238
[58] Field of Search ............... 340/173 R, 173 FF; 307/238, 235 F

[56] References Cited
U.S. PATENT DOCUMENTS

| | | | |
|---|---|---|---|
| 3,540,005 | 11/1970 | Bernhardt | 340/173 FF |
| 3,600,609 | 8/1971 | Christensen | 340/173 FF |
| 3,795,898 | 3/1974 | Mehta et al. | 340/173 FF |

*Primary Examiner*—Stuart N. Hecker
*Attorney, Agent, or Firm*—Owen, Wickersham & Erickson

[57] ABSTRACT

In a metal oxide silicon memory device having an array of static memory cells, a sense amplifier for detecting signals produced by the cells connected between complementary bit lines. The amplifier includes a translator section that shifts the normally high bit and bit voltage levels to a lower voltage level at the control gates of signal output devices connected to output bus lines. Each output bus line has only a single device impedance to ground rather than the normally required stacked or series arrangement of control elements. This provides a low impedance to ground for one of the output bus lines whle the signal variation around threshold provides a relatively high impedance to ground on the other bus line, thereby providing fast response times.

3 Claims, 4 Drawing Figures

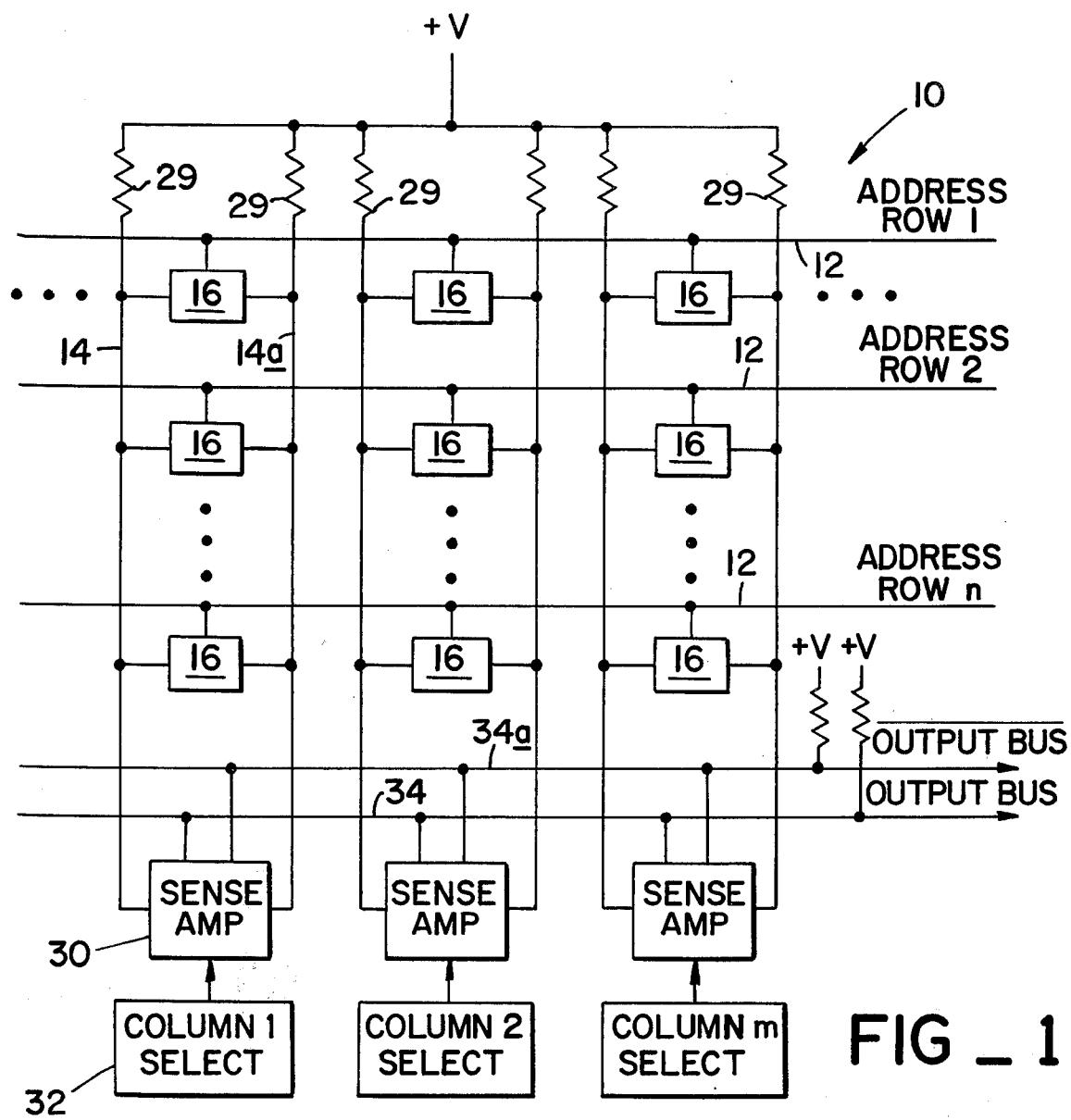
FIG_1
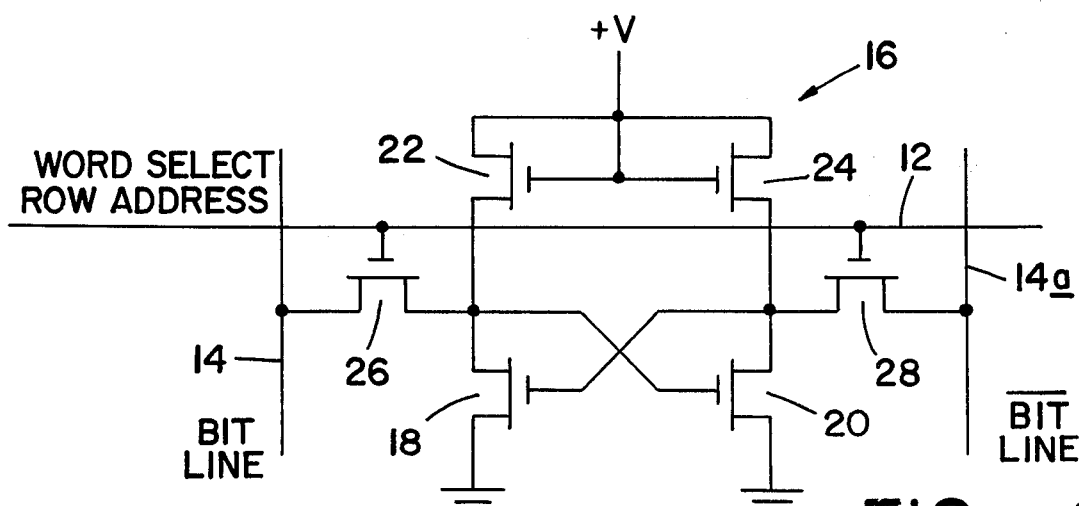
FIG_2

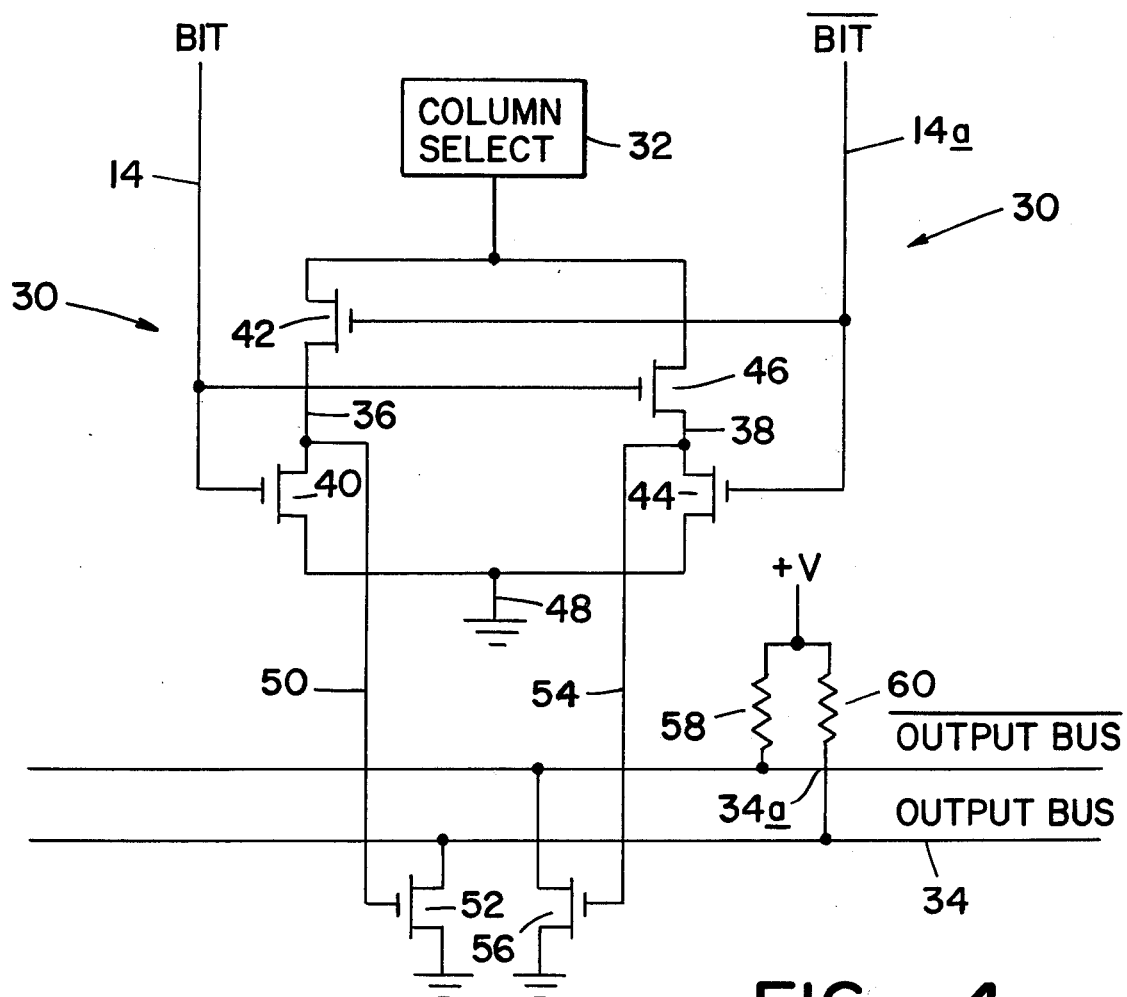
FIG_4
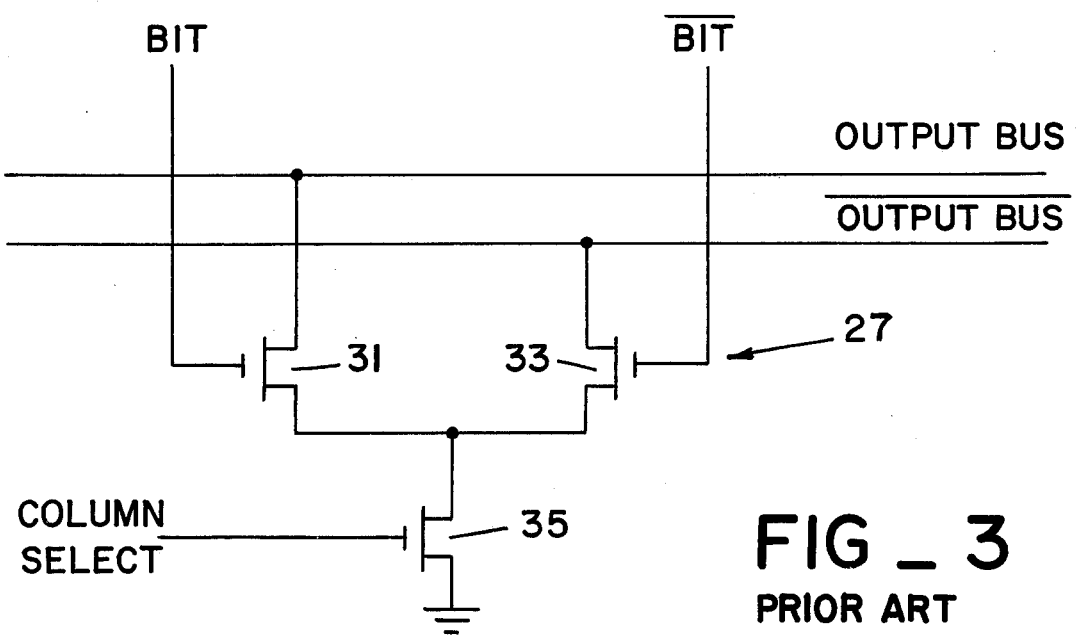
FIG_3
PRIOR ART

SENSE AMPLIFIER FOR STATIC MEMORY DEVICE

BACKGROUND OF THE INVENTION

This invention relates to a sense-amplifier for a metal oxide silicon chip memory device and more particularly to a sense-amplifier for detecting complementary signals produced by a static memory cell comprising one of an array of such cells in a semiconductor device.

In the readout process of a static memory circuit the simultaneous selection of an address line and a bit column produces a differential voltage on the selected column bit lines that must be detected and amplified to provide the proper output signal. It is desirable, if not imperative that such sense-amplifiers utilize a minimum of chip area, operate with a minimum of power and yet with high relative speed. A particular requirement for a sense-amplifier is that it be highly sensitive to voltage fluctuations in the bit lines and yet immune to interference or cross-talk between bit lines of other columns so as to enable the accurate and reliable readout of stored data. In certain prior art sense-amplifiers column selection was done by adding a selection transistor in series with a pair of sense amplifier transistors, each of which was connected to one output bus line. The gate of each transistor of the latter pair was connected directly to one of the bit lines. One disadvantage of connecting the bit lines to the gates of the transistors in this arrangement was that a relatively small impedance differential resulted between the output bus lines and ground potential. This reduced the signal output level of the sense-amplifier. Another disadvantage with this prior art arrangement was that with the selection transistor stacked in series with the sense amplifier-transistors the impedance from the output bus lines to ground was increased by the impedance of the selection transistor. This required higher pull-up impedances for the output bus lines which in turn reduced the inherent speed of the memory device.

SUMMARY OF THE INVENTION

In a semiconductor static memory device utilizing dual bit lines to form bit columns and single address rows, memory cells are provided at the intersection of each row and column to form an array. Activation of each cell, when addressed, produces a voltage variation in the complementary bit lines of the corresponding column which must be sensed and transmitted to output bus lines. According to the present invention this function is accomplished by a sense amplifier connected to the complementary bit lines of each column. Broadly, it comprises a translator section that receives and translates the normally high voltage level bit and inverted bit signals to a lower level and furnishes them to the gates of transistors connected to the output bus and inverted output bus lines. The translator section of the sense amplifier is essentially a pair of networks each having two MOSFET devices in series, each bit line being connected to the gate of one device in each network. The two networks are connected together and to a column select input at one end which provides a positive voltage (in an N-channel device) when the column is selected and ground voltage when not selected. The translator section produces an output at a bias level that is near the threshold level of the signal devices. By translating the high bias voltage appearing on the complementary bit and bit lines to the threshold voltage of the signal devices, the small differential signals produced on the bit lines can cause large changes in the impedance of the signal devices. In the sense-amplifier according to the present invention the output bus lines have only a single device impedance to ground rather than the combined impedance of a stacked arrangement of transistors in series as heretofore required in certain prior art circuits. This allows low impedance to be provided to ground for one of the output buses. On the other bus lines, the variation of the translated signal around the threshold voltage of the signal transistor provides a high impedance to ground because this translated signal is below threshold.

Accordingly, a general object of the present invention is to provide an improved sense-amplifier for a semiconductor static memory device.

Another object of the invention is to provide a sense amplifier for a semiconductor memory device that has a relatively fast response time compared with prior art sense-amplifiers.

Another object of the invention is to provide a sense-amplifier for a semiconductor memory device that is particularly sensitive and relatively immune from interference or crosstalk through unselected sense-amplifiers during readout cycles.

Another object of the invention is to provide a sense-amplifier for a semiconductor memory device that operates on a relatively low power level.

Other objects, advantages and features of the invention will become apparent from the following detailed description of one embodiment presented in conjunction with the accompanying drawing.

BRIEF DESCRIPTION OF THE DRAWING

FIG. 1 is a combined circuit and block diagram showing schematically a portion of a typical semiconductor static memory device;

FIG. 2 is a circuit diagram of a typical static memory cell;

FIG. 3 is a circuit diagram showing a sense amplifier of the prior art; and

FIG. 4 is a circuit diagram showing the detailed circuit for a sense-amplifier embodying the principles of the present invention.

DETAILED DESCRIPTION OF THE PREFERRED EMBODIMENT

With reference to the drawing, FIG. 1 shows a portion of a typical static type random access memory circuit 10 adapted for implementation as a single chip semiconductor memory device. In this circuit a series of address lines 12, designated row 1, row 2 to row $n$ are provided, and these are crossed over by a number of bit columns (column 1, column 2 to column $m$). It should be understood that the circuit of FIG. 1 is merely representative and any number of columns or rows may be used in a memory device of a desired size and capacity. Each bit column is comprised of a pair of bit and bit lines 14 and 14$a$ in what is commonly known as a complementary bit line arrangement. Connected between the complementary bit lines 14, 14$a$ and to a row address line 12 at each column and row intersection is a static memory cell 16, of any suitable circuit configuration, preferably comprising one more MOSFET devices.

One typical random access memory cell which may be used with the present invention is the well known six transistor type, as shown in FIG. 2. As illustrated, it comprises a pair of cross-coupled transistors 18 and 20 which act as a storage element. The transistor 18 is source connected to ground potential and series connected to a load device 22. The transistor 20 is also source connected to ground and series connected to a similar load device 24. The drains and gates of both load devices are connected to the voltage supply for the chip. The gate of the cross coupled transistor 20 is connected to the drain of a gating transistor 26 whose source is connected to a bit line 14. Similarly the gate of transistor 18 is connected to the drain of a gating transistor 28 whose source is connected to the $\overline{\text{bit}}$ line 14a. The gates of transistors 26 and 28 are connected to a word select or Row address line 12.

The complementary bit columns 14 and 14a are all connected in parallel at one end through separate pullup devices 29 to the voltage supply source (V) for the chip (plus voltage, if the device is N-channel). At their other ends each bit column is connected to a sense-amplifier 30 which determines the logic state for a selected memory cell of that particular column. The selection is made by means of an input from a column select circuit, designated by the numeral 32. The outputs of the sense amplifier for each bit column are connected to output bus and $\overline{\text{output bus}}$ lines 34 and 34a which provide the readout signals from the chip.

As shown in FIG. 3, a typical sense-amplifier 27 heretofore used in static memory devices comprised a pair of signal transistors 31 and 33 whose gates are connected directly to the bit and $\overline{\text{bit}}$ lines of a column. The drain of one signal transistor 31 is connected to an output bus line and the drain of the other signal transistor 33 is connected to the $\overline{\text{output bus}}$ line. The sources of both of these transistors are both connected to a column select transistor 35 whose source is connected to ground and whose gate is connected to the column select input. In this prior arrangement the signal transistors 31 and 33 are subject to the relative high voltage level on the bit lines which is a combination of the memory cell output with the superimposed D.C. bias on the bit lines. Thus, the impedance change produced in devices 31 and 33 by the memory cell output is relative small. Moreover, since they are both in series or stacked with the transistor 35, higher pullup impedances are required for the output bus lines, thereby producing a speed disadvantage.

Turning to FIG. 4, each sense-amplifier 30 according to the present invention overcomes the aforesaid problems and comprises a translation section consisting of two networks 36 and 38. The first network comprises a first MOSFET 40 which is series connected to a MOSFET load element 42. The second network has a similar pair of series connected MOSFETs 44 and 46, the latter being a load element. The two networks at one end are connected together and to the column select circuit 32 for the particular bit column which furnishes supply voltage to the circuit when it is activated. At their other ends the networks are connected to ground or substrate potential at a terminal 48. The gates of the two MOSFET's 40 and 46 in their respective networks are connected to the bit line 14 of the bit column, and the gates of the other MOSFET's 44 and 42 are connected to the $\overline{\text{bit}}$ line 14a. Thus, a signal in either the bit or $\overline{\text{bit}}$ lines is furnished to one MOSFET element in both networks.

Now, a lead 50 connected between the MOSFETs 40 and 42 extends to the gate of a signal device 52 which is another MOSFET whose drain is connected to the output bus line 34 and whose source is connected to ground or substrate potential. Another lead 54 is connected between the MOSFET's 44 and 46 of the other network 38 and extends to the gate of the other signal device, a MOSFET element 56. The drain of this latter MOSFET is connected to the $\overline{\text{output bus}}$ line 34a and its source is connected to ground. The output bus line 34 and $\overline{\text{output bus}}$ line 34a are both connected to the chip power source through a pair of load elements 58 and 60.

In operation, when a word select Row 12 is addressed and a bit column 14, 14a is selected in a readout procedure, the particular memory cell 16 at the intersection of this selected row and column is activated and the information in this storage element is transferred directly to the bit lines 14 and 14a. This provides a change in voltage level on the complementary bit and $\overline{\text{bit}}$ lines of the selected column corresponding to whatever data is stored in the selected memory cell. For example, when a One level is being read out of the memory cell the bit level may be 5 volts and the $\overline{\text{bit}}$ level may be 3 volts, and when a zero level is being read out of the memory cell, the voltages on the bit and $\overline{\text{bit}}$ lines are interchanged. The complementary signals from the memory cell (e.g. 5 volts on the bit line 14 and 3 volts on the $\overline{\text{bit}}$ line 14a) are supplied to the translator networks 36 and 38 of the sense-amplifier 30 for that column. Thus, the MOSFET's 40, 42, 44 and 46 are all activated, as a relatively high voltage from the column select line is supplied to both networks. The load device and its series connected MOSFET in each network are selected to have a suitable impedance rate so that the output from each network is reduced in accordance with the preselected ratio. Thus, a lower output level (e.g. 2.6 volts) is produced in the lead 54 which is supplied to the gate of the signal element 56, and an output of a lower level (e.g. 0.8 volts) is produced in the lead 50 supplied to the gate of the other signal element 52. If it is assumed that the threshold voltage ($V_T$) for both signal devices is 1 volt, it is apparent that the device 56 will be activated, and will therefore pull the connected $\overline{\text{output bus}}$ line 34a to ground. Since the voltage applied to the other signal device 52 is below its threshold, it will not be activated and, therefore, the output bus line 34 will be at the voltage level of the power source because of the load element 60.

From the foregoing it should be apparent that the voltage level from the memory cell 16 can remain relatively high which enhances its stability and allows it to be essentially immune from cross-talk or coupling from other cells. Yet, the relatively low voltage levels applied to the signal devices 52 and 56 which are near the threshold of these elements enables them to operate effectively. Rather than a stacked or series arrangement of multiple elements, the output bus has only a single device impedance to ground. The variation of the signal level around the threshold of the signal devices provides a high impedance differential to ground on the two bus lines 34 and 34a. As a result, the memory device will operate with relatively high signal levels from its sense amplifiers 30 and with fast response time.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. In a MOSFET memory device comprising an array of static memory cells each connected to one of a series of address lines into a pair of complementary bit lines comprising one of a series of bit columns, pullup means connected from a voltage supply to each said bit line for applying a uniform bias voltage, and column select means for each column for providing a voltage to select said column, a sense-amplifier for each bit column connected to complementary output bus lines which are connected through a pair of load elements to said voltage supply and comprising:

a pair of MOSFET signal transistors each having a drain connected to a said output bus line, a source connected to a voltage return, and an insulated gate;

a voltage translator section connected to said bit lines of the bit column and to said gates of said signal transistors for shifting the relatively high voltage levels of said bit lines, which includes said uniform bias, to a voltage level close to the threshold of said signal transistors;

said translator comprising a pair of networks connected to a voltage supply, each said network having a first MOSFET transistor and a second MOSFET transistor connected in series with the source of said first transistor connected to said voltage return and the drain of said second transistor connected to said column select means;

the gate of the first transistor of said first network and the gate of the second transistor of said second network being together connected to one of the bit lines of said column;

the gate of one of said signal transistors being connected to a node between the first and second transistor of said first network and the gate of the other of said signal transistors being connected to a node between the first and second transistors of said second network.

2. A static MOSFET memory device comprising:

an array of memory cells, each connected to one of a series of address lines and to a pair of complementary bit lines forming one of a series of bit columns;

a pair of complementary output bus lines connected through a pair of load elements to a constant voltage supply source;

pullup means for applying a constant direct current bias to the complementary bit lines of each said bit column;

a sense-amplifier for each said bit column, each said sense-amplifier comprising a pair of MOSFET signal transistors each having a source connected to ground potential and a drain connected to one of said output bus lines;

and a voltage translater section connected to said complementary bit lines of the bit column and to the gates of said MOSFET signal transistors for shifting the voltage levels on said bit lines to a lower level close to the threshold of said signal transistors.

3. The memory device of claim 2 wherein said translator section comprises a pair of networks connected to a voltage supply for said device, each said network having a pair of MOSFETs connected in series whose gates are cross connected to different bit lines of the same complementary pair of bit lines, and wherein a series node in each said network is connected to the gate of one of said MOSFET signal transistors.

* * * * *